(12) United States Patent
Nonaka et al.

(10) Patent No.: US 10,859,733 B2
(45) Date of Patent: Dec. 8, 2020

(54) OPTICAL FUNCTIONAL FILM AND METHOD FOR PRODUCING THE SAME

(71) Applicant: AZ Electronic Materials (Luxembourg) S.a.r.l., Luxembourg (LU)

(72) Inventors: Toshiakai Nonaka, Kakegawa (JP); Naofumi Yoshida, Kakegawa (JP); Yuji Tashiro, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 298 days.

(21) Appl. No.: 15/570,110

(22) PCT Filed: Apr. 13, 2016

(86) PCT No.: PCT/EP2016/000608
§ 371 (c)(1),
(2) Date: Oct. 27, 2017

(87) PCT Pub. No.: WO2016/177448
PCT Pub. Date: Nov. 10, 2016

(65) Prior Publication Data
US 2018/0149774 A1 May 31, 2018

(30) Foreign Application Priority Data

May 1, 2015 (JP) .................... 2015-094323

(51) Int. Cl.
*G02B 27/00* (2006.01)
*G02B 1/111* (2015.01)
(Continued)

(52) U.S. Cl.
CPC ............ *G02B 1/111* (2013.01); *C03C 17/007* (2013.01); *C03C 17/009* (2013.01); *C03C 17/30* (2013.01);
(Continued)

(58) Field of Classification Search
CPC ......... G02B 1/11; G02B 1/111; C03C 17/007; C03C 2217/478; C03C 17/30;
(Continued)

(56) References Cited

U.S. PATENT DOCUMENTS

2007/0048509 A1  3/2007  Yoneyama et al.
2009/0169859 A1  7/2009  Biteau et al.
(Continued)

FOREIGN PATENT DOCUMENTS

EP   1329745 A1    7/2003
JP   H08056002 A   2/1996
(Continued)

OTHER PUBLICATIONS

International Search Report for PCT/EP2016/000608 dated Jun. 30, 2016.
(Continued)

*Primary Examiner* — Jade R Chwasz
*Assistant Examiner* — Jyotsna V Dabbi
(74) *Attorney, Agent, or Firm* — Faegre Drinker Biddle & Reath LLP (57) ABSTRACT

An optical functional film containing a siliceous material, wherein a refractive index $n_A$ of one surface A of said optical functional film to light is larger than a refractive index $n_b$ of the other side surface B to light, and the refractive index to light gradually decreases from said surface A to said surface B and wherein when a refractive index of a medium X coming into contact with said surface A is $n_x$ and a refractive index of a medium Y coming into contact with said surface B is $n_y$, the relation $n_y<n_b<n_a<n_x$ is satisfied and wherein the film is manufactured by the steps of a first layer forming step and a second layer forming step; and a heating step of
(Continued)

heating to cure said first layer and said second layer, wherein the contacting parts of said first layer and said second layer are compatibilized.

11 Claims, 5 Drawing Sheets (51) Int. Cl.
    *C03C 17/00*     (2006.01)
    *C03C 17/30*     (2006.01)
    *C08G 77/398*     (2006.01)
    *C08J 3/28*     (2006.01)
    *C09D 5/00*     (2006.01)
    *C09D 183/08*     (2006.01)
    *C08G 77/00*     (2006.01)
    *H01L 31/0216*     (2014.01)
    *H01L 33/44*     (2010.01)
    *H01L 51/52*     (2006.01)

(52) U.S. Cl.
    CPC .............. *C08G 77/398* (2013.01); *C08J 3/28* (2013.01); *C09D 5/006* (2013.01); *C09D 183/08* (2013.01); *C03C 2217/478* (2013.01); *C03C 2217/73* (2013.01); *C03C 2217/732* (2013.01); *C03C 2217/91* (2013.01); *C03C 2218/32* (2013.01); *C08G 77/70* (2013.01); *C08J 2383/08* (2013.01); *H01L 31/02168* (2013.01); *H01L 33/44* (2013.01); *H01L 51/5262* (2013.01)

(58) Field of Classification Search
    CPC ............ C03C 2217/73; C03C 2218/32; C03C 17/009; C03C 2217/732; C03C 2217/91; C08G 77/398; C08G 77/70; C08J 3/28; C08J 2383/08; H01L 31/02168; H01L 33/44; H01L 51/5262; C09D 5/006; C09D 183/08
    USPC .......................................................... 359/601
    See application file for complete search history.

(56) References Cited

U.S. PATENT DOCUMENTS

| | | |
|---|---|---|
| 2013/0258482 A1 | 10/2013 | Takahashi et al. |
| 2014/0309317 A1 | 10/2014 | Takase et al. |
| 2015/0007877 A1* | 1/2015 | Brainard ........... H01L 31/02168 136/256 |
| 2015/0329679 A1 | 11/2015 | Yoshida et al. |
| 2016/0194451 A1 | 7/2016 | Yoshida et al. |

FOREIGN PATENT DOCUMENTS

| | | |
|---|---|---|
| JP | 2000089001 A | 3/2000 |
| JP | 2005277181 A | 10/2005 |
| JP | 2007052345 A | 3/2007 |
| JP | 2009525498 A | 7/2009 |
| JP | 2012181293 A | 9/2012 |
| JP | 2014122306 A | 7/2014 |
| JP | 2014122309 A | 7/2014 |
| WO | WO-2010080684 A2 | 7/2010 |

OTHER PUBLICATIONS

Written Opinion of the International Searching Authority for PCT/EP2016/000608 dated Jun. 30, 2016.

\* cited by examiner the wavelength dependency of transmittance of a glass substrate

FIG.5 the wavelength dependency of transmittance of Comparative Example 1 and Comparative Example 2

FIG.6 the wavelength dependency of transmittance of Example 1

FIG.7 the wavelength dependency of transmittance of Comparative Example 3 to 5

OPTICAL FUNCTIONAL FILM AND METHOD FOR PRODUCING THE SAME

CROSS-REFERENCE TO RELATED APPLICATIONS

This application is a national stage application (under 35 U.S.C. § 371) of PCT/EP2016/000608, filed Apr. 13, 2016, which claims benefit of Japanese Application No. 2015-094323 filed May 1, 2015, both of which are incorporated herein by reference in their entirety.

BACKGROUND OF THE INVENTION

Technical Field

The present invention relates to a coating type composition to be used as a material for forming an optical functional film to improve antireflection, optical extraction efficiency etc., and an optical functional film comprising the coating type composition. In detail, the present invention relates to an optical functional film, refractive index of which is changed to gradually decrease, and which is superior in transparency, heat resistance, optical resistance and chemical resistance, and a method for producing the optical functional film, light extraction efficiency of which is possible to be improved.

Background Art

In late years, in correspondence to a larger screen of displays including liquid crystal displays and organic EL (electroluminescence) displays, displays that can provide images having the less reflection glare and being clearer and softer for eyes than ever, have been desired. In addition, improvement of the utilization efficiency (incoupling efficiency) of sunlight is needed to improve the generation efficiency of solar battery, because the conversion efficiency from light energy to electric energy is coming close to the theoretical value. Similarly, improvement of the light extraction efficiency is expected rather than the internal conversion efficiency also in terms of the luminous efficiency of light emitting devices such as organic ELs, LEDs etc.

These, the glare to glass surface and reduction in the light incoupling efficiency or the light extraction efficiency results from the reflection generated in the interface of two layers having different refractive indices. Besides these problems, such a reflection may cause the wavelength dependency of transmittance due to the multiple reflection in a layer.

Therefore, antireflection film and antireflection function are the important member to improve the light utilization efficiency. The reflectance $R_f$ at the interface of a layer consisting of a material having refractive index $n_0$ and a layer consisting of a material having refractive index $n_1$ can be obtained by the following formula:

$$R_f = (n_1 - n_0)^2 / (n_1 + n_0)^2$$

Figure 1:
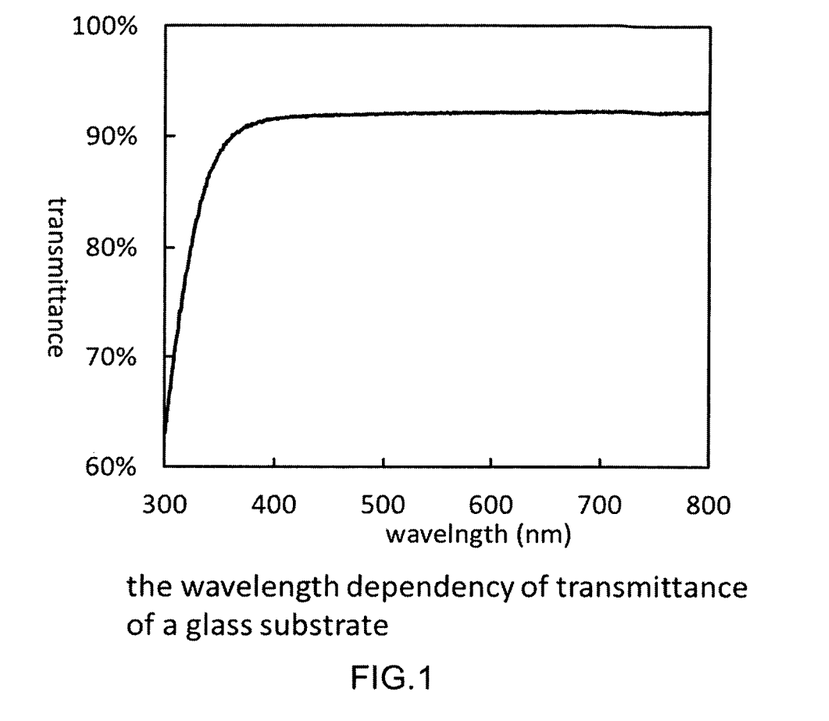
FIG. 1 is a figure showing the wavelength dependency of transmittance of a glass substrate.

For example, the reflectance ($R_f$) of the visible light ($\lambda$=550 nm) at the interface of glass (refractive index $n_1$=1.49) and air layer (refractive index $n_0$=1.00) calculated from this formula is about 3.89%. FIG. 1 shows a transmittance spectrum of an alkali-free glass substrate (thickness of 0.7 mm). The average transmittance from 450 nm to 800 nm is 92.1%. It can be said that this corresponds almost to a theoretical value calculated from the formula (the reflection of the incident light at the interface of air and the glass substrate is about 3.89% and additionally that at the interface of the glass substrate and air is further about 3.89%, so that the transmittance of glass substrate is about 92.25%).

It is common to provide an antireflection film having an optimized film thickness and a refractive index between two layers in order to prevent or suppress reflection of light. For example, an antireflection film is formed on a surface of glass to prevent the above-described reflection at the interface of glass and air layer.

Due to this antireflection film, the reflectance can be reduced by the optical interference between the reflection at the interface of a layer having a low refractive index (for example, air layer) and an antireflection film, and the reflection at the interface of an antireflection film and a layer having a high refractive index (for example, glass). The refractive index $n_2$, which is most suitable for the antireflection film under the above-described conditions, is shown as follows:

$$n_2 = (n_1 / n_0)^{1/2}$$

For example, a layer having a very low refractive index such as 1.22 is required between air layer and glass. Furthermore, the film thickness of a layer having a low refractive index layer is $\lambda/4$ ($\lambda$ is here a wavelength of incident light) to make the reflected lights respectively of the layer having a low refractive index and the layer having a high refractive index in the reverse phase each other, and when the wavelength is set on $\lambda$=550 nm, which is a center of visible light region, the most suitable film thickness is 0.14 µm.

However, it is difficult to allow the reflected light to compensate with each other by completely making in the reverse phase, and it is assumed to use not a light having a single wavelength but a light having plural wavelengths or the like, so that making lower wavelength dependency of transmittance is a problem to be solved when an antireflection film is used.

In addition, some antireflection films of multilayered structure are also investigated. As an example of such a film, a film which is prepared by sequentially laminating a layer having a high refractive index and a layer having a low refractive index on a transparent substrate and by reducing the reflectance through interference effect of the reflected light from the surface of the layer having a low refractive index and that from the surface of the layer having a high refractive index to add to the film an antireflection function is suggested. For example, in Patent document 1, an antireflection film, wherein a two-layer structure consisting of a layer having a low refractive index and a layer having a high refractive index is formed using a coating type material and the refractive index and the film thickness of each layer are optimally designed to make the film capable of antireflection, is disclosed. However, in the prevention of reflection according to this method, variation of film thickness causes variation of reflectance. In addition, since the optimal film thickness varies in accordance with wavelength of light, irregular reflection, color unevenness etc. leave much room for improvement.

In addition, an antireflection film, wherein the refractive index of the part coming into contact with the substrate is equal to that of the substrate, and the antireflection layer which reduces the refractive index gradually or stepwise towards the most outer layer and uniformly reduces the reflectance over a wide range of wavelength is provided on a transparent substrate, is suggested. For example, in Patent document 2, a hard coat layer, which is provided on a plastic substrate by chemical vapor deposition method (CVD method) so as to gradually reduce the refractive indices by dividing into ten stages, is disclosed. However, it is hard to say that versatility thereof is sufficient because the method using a vacuum step is expensive, and the range of the refractive index of the hard coat layer that can be made by CVD method, is limited. In addition, in Patent document 3, a multilayer thin film with refractive index gradient having high antireflection performance, which is prepared by laminating three or more layers having different refractive indices, including at least one layer formed by sol-gel method using metal alkoxide, by coating step, is suggested. However, it is necessary to form a great deal of layers if the change of the refractive indices is brought close to more continuous. Thus, productivity thus tends to decrease, and it is difficult to apply the multilayered thin film to the production of large screen display. In Patent document 4, a method for preparing a refractive index gradient film by laminating plural layers while discharging two kinds of materials having different refractive indices using ink-jet method is suggested. However, it is needed for this method to precisely control the discharge of each ink-jet nozzle, and to form layers having desired refractive indices, so that it is very difficult to uniformly produce a film which is applicable to large screen display.

PRIOR ART DOCUMENTS

Patent Documents

[Patent document 1] JP-2000-89001A1
[Patent document 2] JP1996-56002A1
[Patent document 3] JP2007-52345A1
[Patent document 4] JP2012-181293A1

SUMMARY OF THE INVENTION

Problems to be Solved by the Invention

Taking account of such problems to be solved, the present invention provides a light functional film applicable to antireflection film, which is excellent in productivity and capable to form large area film, and has small wavelength dependency of transmittance, high optical transparency and excellent heat resistance, light resistance and chemical resistance.

Means for Solving the Problems

The optical functional film of the present invention is characterized by comprising a siliceous material, wherein a refractive index $n_A$ of one surface A of the optical functional film to light is larger than a refractive index $n_B$ of the other side surface B to light, and the refractive index to light gradually decreases from the surface A to the surface B.

The producing method according to the present invention is characterized by comprising a first layer forming step which comprises coating a composition comprising a polysiloxane and a solvent on a substrate and performing insolubilizing treatment of the surface to form the first layer; a second layer forming step which comprises coating a composition comprising a polysiloxane that is different from the above polysiloxane and a solvent that is identical to or different from the above solvent on the surface of the first layer to form the second layer; and a heating step of heating to cure the first layer and the second layer, wherein the contacting parts of the first layer and the second layer are compatibilized between after starting the second layer forming step and until ending the heating step.

The semiconductor device according to the present invention is characterized by comprising the above-mentioned optical functional film on a substrate surface.

Effects of the Invention

The present invention provides an optical functional film that has small wavelength dependency of transmittance, high optical transparency, and excellent heat resistance, light resistance and chemical resistance or the like. The optical functional film is useful as an antireflection film formed on the surface of a semiconductor device or a protective film for a light extraction surface of a light emitting device.

In addition, the optical functional film of the present invention is excellent in productivity, capable to form a large area film, and has good economy and general versatility.

DETAILED DESCRIPTION OF THE INVENTION

Mode for Carrying out the Invention

Embodiments of the present invention are described below in detail.

Optical Functional Film

The optical functional film of the present invention comprises a siliceous material. The siliceous material is here a material mainly composed of a siloxane, and a method for forming the optical functional film comprising such a siliceous material is described below.

Figure 2:
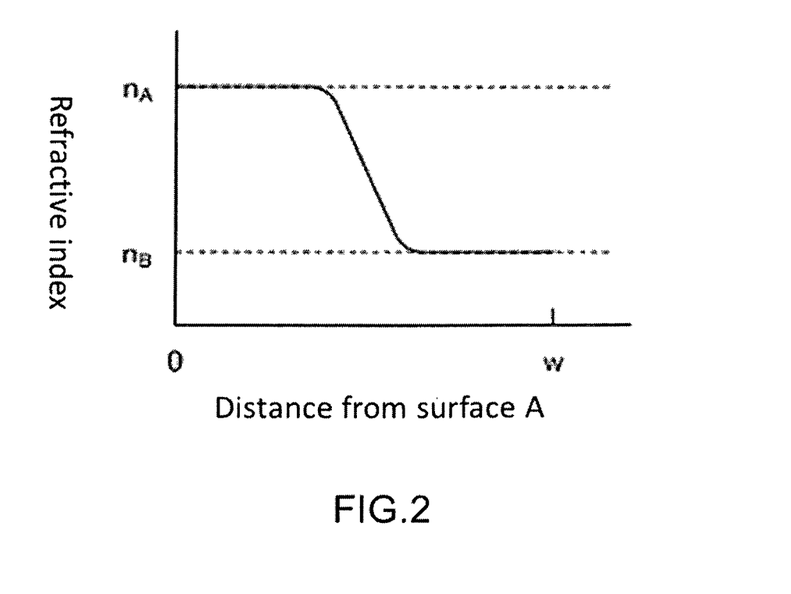
FIG. 2 is a figure showing the relation of the refractive index to the distance from one surface of an optical functional film according to other embodiment of the present invention.
Figure 3:
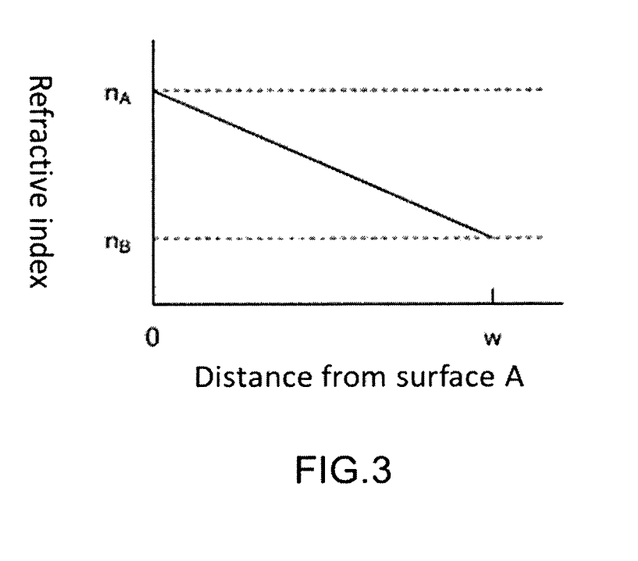
FIG. 3 is a figure showing the relation of the refractive index to the distance from one surface of an optical functional film according to other embodiment of the present invention.
Figure 4:
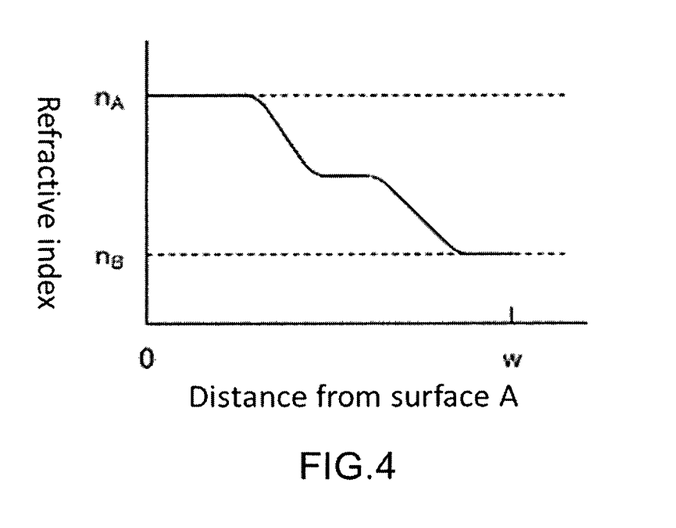
FIG. 4 is a figure showing the relation of the refractive index to the distance from one surface of an optical functional film according to one embodiment of the present invention.
Figure 5:
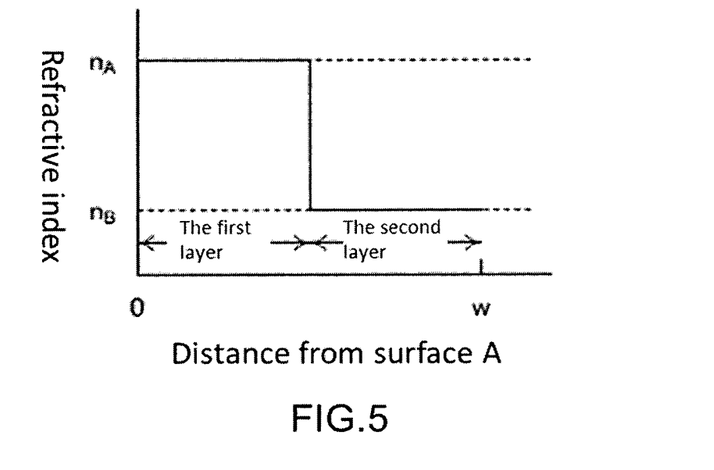
FIG. 5 is a figure showing the relation of the refractive index to the distance from one surface of a conventional optical functional film prepared by laminating layers having different refractive indices.

The optical functional film has an optical characteristic in the present invention. In other words, refractive indices to light are different at one surface and other surface of the optical functional film. Specifically, when both surfaces of the optical functional film is defined respectively as A and B, the refractive index $n_A$ of the surface A to light is larger than the refractive index $n_B$ of the other side surface B to light. And, the refractive index to light decreases gradually from the surface A to the surface B. Here, the refractive index varies depending on the wavelength of incident light, but, for example, in the case of display devices utilizing light, it is enough to consider the refractive index to the light having a wavelength of around 555 nm, which is the sensitivity peak of human eyes. In addition, the term "the refractive index to light gradually decreases" means here that when the refractive indices are plotted with respect to the distance in a thickness direction (depth direction) from surface A, they do not discontinuously vary. Specifically, it means that when the refractive indices with respect to the distance (depth) from the surface A is plotted, they gently vary as shown in FIGS. 2 to 4. Conversely, as shown in FIG. 5, even though the refractive indices are different at the surface A and at the surface B, if the refractive indices discontinuously vary at a certain distance from the surface A, it cannot be said that "the refractive indices to light gradually decrease". For example, the refractive indices show such a variation as shown in the FIG. 4 when two transparent layers having different refractive indices are adhered. In this case, there is an interface between the two layers, and the refractive index discontinuously varies at the interface. And, the effect accomplished by the present invention cannot be obtained because reflection of light occurs at this interface. In other words, it can be said that the optical functional film of the present invention has no interface though the refractive indices are different at the both surfaces. In addition, a method for suppressing total reflection of light by laminating stepwise several films, in which the differences of refractive indices are small, has been conventionally investigated; however, the interface existed even by such a method although the differences of refractive indices were small. According to the present invention, an optical functional film having a simpler structure and involving no interface inside is provided. In addition, the term "light" in the present invention means electromagnetic wave such as ultraviolet light, visible light, infrared light and so on.

The refractive index may gradually vary from the surface A having a higher refractive index to the surface B having a lower refractive index. For example, as shown in FIG. 2, the refractive index may be kept unvaried up to a certain distance from the surface A, vary within a certain range of distance, and thereafter be kept constant to the surface B. This kind of optical functional film is preferable because it can be relatively easily prepared by a method described below. In addition, the refractive index may monotonously vary from the surface A to the surface B as shown in FIG. 3, and may vary in two stages as shown in FIG. 4. In this way, the optical functional film of the present invention causes no light reflection within the film because there is no interface within the film.

The optical functional film of the present invention is applied to semiconductor devices and or the like as described below.

Therefore, the surface A and the surface B of the optical functional film are arranged so as to come into contact with various mediums. For example, when the optical functional film is used for the surface of a light receiving device such as a solar cell, the surface A having a higher refractive index usually comes into contact with the surface of the semiconductor device and the surface B having a lower refractive index usually comes into contact with air. In addition, when the optical functional film of the present invention is used for the surface of a light emitting device, the surface A having a higher refractive index may come into contact with the surface of the light emitting device, and the surface B having a lower refractive index may come into contact with a glass protective film further provided on the optical functional film.

As mentioned above, in the optical functional film of the present invention, its surfaces may come into contact with other mediums.

At this time, when the refractive index of a medium X coming into contact with the surface A is $n_X$ and the refractive index of a medium Y coming into contact with the surface B is $n_Y$, the relation: $n_Y \leq n_B < n_A \leq n_X$ is preferably satisfied. Particularly, when the surface B comes into contact with air, the relation: $1 \leq n_B < n_A \leq n_X$ is preferably satisfied. And, if the difference between the refractive index of a surface and that of a medium coming into contact with the surface is large, the light reflex becomes large at the contact interface. Therefore, it is preferable that the difference between $n_Y$ and $n_B$ and the difference between $n_A$ and $n_X$ are small. Ideally, $n_B - n_Y = 0$ and $n_X - n_A = 0$. In addition, even if $n_A < n_X$ is satisfied, but if difference between $n_A$ and $n_X$ is less than 1%, the effect of the present invention is not substantially lost. Here, when light is used, each refractive index is one for light having a wavelength of 555 nm.

When the optical functional film of the present invention is used for a protective film for light emitting devices and an antireflection film for semiconductor devices, it will come into contact with air. Then, the surface B having a lower refractive index is generally arranged to come into contact with air. In this case, most preferably fly is 1.

In the optical functional film of the present invention, if $n_X - n_A$ is close to 0, no reflection occurs because no interface appears between the medium X and the surface A. As this result, the multiple reflection in the layer is prevented, and the wavelength dependency of transmittance due to the interference disappears.

In addition, in the present invention, the refractive index of the film surface can be measured by Abbe method refraction system using all reflection angles with the prism of the known refractive index (for example, Abbe's refractometer DR series and NAR series, manufactured by Atago Co., Ltd., or precision refractometer KPR-3000, manufactured by Shimadzu Corporation, or the like).

In addition, the reflection is suppressed in the optical functional film of the present invention because there is no interface caused by layers having different refractive indices within the film. For example, when the optical functional film of the present invention is used for a display device utilizing visible light, total light transmittance for light having a wavelength of 555 nm is preferably not less than 90%, and Haze is more preferably not more than 10%. In this way, the optical functional film of the present invention has an excellent optical property, so that it has high utility value as an antireflection film and a protective film of optical material.

Method for Producing an Optical Functional Film

The optical functional film of the present invention can be formed by any method. Depending on a formation method, for example, the optical functional film that indicates the change of refractive indices as shown in FIGS. 2 to 4 can be formed. In particular, to form the optical functional film that indicates the change of refractive index as shown in FIG. 2 is relatively simple and excellent in productivity.

The optical functional film shown in FIG. 2 can be manufacture, for example, according to the following way:

A composition comprising a polysiloxane and a solvent is coated on a substrate and insolubilizing treatment of the surface is performed to form the first layer (a first layer forming step). Subsequently a composition comprising a polysiloxane that is different from the above polysiloxane and a solvent that is identical to or different from the above solvent is coated on the surface of the first layer to form the second layer (a second layer forming step). Thereafter, the first layer and the second layer are heated to cure (heating step). In other words, first, the first layer containing polysiloxane is formed on the substrate. The surface of this first layer coming into contact with the substrate corresponds to the above-mentioned surface A or B. And, the second layer comprising a different polysiloxane is formed thereon. The surface of this second layer (the surface not coming into contact with the first layer) corresponds to the above-mentioned surface B or A.

Here, different polysiloxanes are mixed with each other in the vicinity of the contacting parts of the first layer and the second layer between after starting the second layer forming step namely from the time when the composition for forming the second layer comes into contact with the first layer, and until ending the heating step, and the interface of the contact surfaces disappears. Specifically, immediately after the second layer is coated on the first layer, the interface disappears through elution of a part of polysiloxane constituting the first layer by the solvent contained in the composition forming the second layer, or through mutual compatibilization of polysiloxanes constituting the first layer or the second layer in the heating step. Thereafter, this film is heated to convert the polysiloxanes to siliceous materials, and then the optical functional film of the present invention can be formed. Here, since different polysiloxanes are used respectively in the first layer and the second layer, the refractive indices of two surfaces of the formed optical functional film become different.

The method for manufacturing the optical functional film is explained in detail below.

First, a polysiloxane as a raw material of a siliceous material is prepared. Since this polysiloxane is to be converted to a siliceous material later by heating, it is preferably a polysiloxane having a silanol group. When a polysiloxane has a silanol group, the conversion to a siliceous material by heating can be easily done.

In addition, for the formation of the optical functional film of the present invention, it is necessary to prepare two kinds of composition comprising polysiloxane in order to form the first layer and the second layer. Here, each composition contains a different polysiloxane. The siliceous materials formed from polysiloxanes as raw materials show different refractive indices depending on the kind of polysiloxane etc. In this way, the optical functional film of the present invention is a combination of siliceous materials that are formed from different polysiloxanes and have different refractive indices.

In the present invention, polysiloxane refers to a polymer containing Si—O—Si bond. In the present invention, the polysiloxane includes organic polysiloxane substituted by an organic group besides unsubstituted inorganic polysiloxane. Such a polysiloxane generally has a silanol group, an alkoxysilyl group or an aryloxysilyl group. These groups are assumed to contribute to the curing reaction when polysiloxanes are converted to the siliceous materials. Therefore, it is preferable for polysiloxanes to have these groups.

With respect to the polysiloxane used in the present invention, structure thereof is not limited in particular, and it can be selected from any polysiloxane depending on the purpose. The skeleton structure of polysiloxane can be classified into a silicone skeleton (the number of oxygen atom binding to silicon atom: 2), a silsesquioxane skeleton (the number of oxygen atom binding to silicon atom: 3) and a silica skeleton (the number of oxygen atom binding to silicon atom: 4), according to the number of oxygen binding to the silicon atom. In the present invention, any of these can be used. The polysiloxane molecule may comprise a combination of a plurality of these skeleton structures.

In addition, when an organic polysiloxane is used, the substituent contained therein can be selected from any one unless it impairs the effect of the present invention. Such a substituent includes a substituent containing no Si—O bond that constitutes a siloxane structure, specifically, an alkyl group, a hydroxyl alkyl group and an aryl group, and a group constituted by substituting a hydrogen atom in these groups with an unsaturated hydrocarbon group.

In addition, a reactive group excluding silanol group or alkoxysilyl group, for example, a carboxyl group, a sulfonyl group and an amino group may be contained in polysiloxane in such an amount that is not detrimental to the effect of the present invention, but the reactive group is preferably less, since it generally has a tendency to deteriorate the preservation stability of coating compositions. Specifically, it is preferably 10 mol % or less based on the total number of hydrogen or substituents binding to the silicon atom, and particularly preferred is when it is not contained at all.

With respect to the polysiloxane used in the present invention, oxygen in the Si—O—Si bond may be replaced with nitrogen unless it impairs the effect of the present invention. In other words, silazane structure and silsesquiazane structure may be contained as a part of polysiloxane. Such a polymer is also called polysiloxazane.

In one embodiment of the method for manufacturing the optical functional film of the present invention, two kinds of composition comprising polysiloxane are used. For example, each polysiloxane contained in these compositions differs in molecular weight, the substituent binding to a silicon atom and the blending ratio of comonomers in copolymer. When an optical functional film is set, each polysiloxane is coordinated depending on the refractive index of a medium coming into contact with it. Therefore, various kinds of polysiloxane can be used and they are not particularly limited; however, they include, for example, the following:

(I) the polysiloxane having a refractive index of 1.3 to 1.6 and used to form a layer consisting of a siliceous material is one obtained by hydrolyzing and condensing a silane compound of the general formula (1) in the presence of an acidic or basic catalyst:

$$R^{11}{}_{n1}Si(OR^{12})_{4-n1} \qquad (1)$$

wherein
$R^{11}$ is a linear, branched or cyclic alkyl group having 1 to 20 carbon atoms, in which any methylene may be replaced with oxygen, or a aryl group having 6 to 20 carbon atoms, in which any hydrogen may be replaced with fluorine,
$R^{12}$ is hydrogen or an alkyl group having 1 to 10 carbon atoms, preferably, an alkyl group having 1 to 6 carbon atoms, and
n1 is 0 to 2. From such a polysiloxane, a siliceous material having a refractive index of around 1.30 to 1.60 can be generally obtained.

In the general formula (1), $R^{11}$ includes, for example, a methyl group, an ethyl group, a n-propyl group, an isopropyl group, a t-butyl group, a n-hexyl group, a n-decyl group, a trifluoromethyl group, a 2,2,2-trifluoroethyl group, a 3,3,3-trifluoropropyl group, a cyclohexyl group, a phenyl group, a tolyl group etc. The compound in which $R^{11}$ is the methyl group is preferable because raw materials for it are easily obtained, film hardness after cured is high and it has high chemical resistance. In addition, the phenyl group is preferable because it increases solubility of the polysiloxane to a solvent and a cured film becomes hard to cause cracks.

On the other hand, in the general formula (1), $R^{12}$ includes, for example, a methyl group, an ethyl group, a n-propyl group, an isopropyl group, a n-butyl group etc. A plurality of $R^{12}$ are included in the general formula (1), which may be each identical or different.

Specific trialkoxysilane compounds represented by the general formula (1) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane etc.

Among them, methyltrimethoxysilane, methyltriethoxysilane, phenyltrimethoxysilane, and phenyltriethoxysilane are preferable since they are compounds easy to obtain.

In addition, specific tetraalkoxysilane compounds represented by the general formula (1) include, for example, tetramethoxysilane, tetraethoxysilane, tetrapropoxysilane, tetrabutoxysilane etc. Among them, tetramethoxysilane, tetraethoxysilane etc. are preferable since they have high reactivity.

The silane compound (1) used for production of the polysiloxane (I) may be one kind or a combination of two or more kinds. Here, when tetraalkoxysilane is used as the silane compound (1), there is a tendency that pattern reflow decreases. It is thought that this occurs due to the increase of crosslinking density of polysiloxane. However, sensitivity has possibility of reduction when the blending ratio of tetraalkoxysilane is too high. For this reason, when tetraalkoxysilane is used as the raw material for the polysiloxane (I), its blending ratio is preferably 0.1 to 40 mol %, more preferably 1 to 20 mol % with respect to the total number of moles of trialkoxysilane and tetraalkoxysilane.

Preferably, the polysiloxane (I) used for the present invention is one manufactured by hydrolyzing and condensing the above-mentioned silane compound in the presence of an acidic or basic catalyst.

For example, the polysiloxane (I) can be manufactured according to a method comprising dropping a silane compound or mixture thereof into a reaction solvent consisting of an organic solvent, a catalyst and water, hydrolyzing and concentrating, optionally refining by neutralization and washing, concentrating, and thereafter optionally replacing the reaction solvent with a desired organic solvent.

The organic solvent used for the reaction solvent includes, for example, a hydrocarbon-based solvent such as hexane, toluene, xylene and benzene, an ether-based solvent such as diethyl ether and tetrahydrofuran, an ester-based solvent such as ethyl acetate and propylene glycol monomethyl ethyl acetate, an alcohol-based solvent such as methanol, ethanol, isopropanol, butanol and 1,3-dipropanol, a ketone-based solvent such as acetone, methyl ethyl ketone and methyl isobutyl ketone. The organic solvent can be used, alone or in combination of plural ones. In addition, the amount of the organic solvent to be used is generally 0.1-10 times, preferably 0.5-2 times that of the weight of the mixed solution of the silane compound.

The reaction temperature to carry out the hydrolysis and the condensation reaction is generally 0 to 200° C., preferably 10 to 60° C. At this time, the temperature of the dropping silane compound may be identical to or different from that of the reaction solvent. The reaction time varies according to the kind of the silane compound and the like, but is usually from several dozens of minutes to several dozens of hours, preferably 30 minutes or more. The properties suitable for the objective use can be obtained by setting various conditions in the hydrolysis and the condensation reaction, for example, amount of catalyst, reaction temperature, reaction time, or the like in consideration of reaction scale, and size and shape of reaction vessel, or the like.

The basic catalyst includes organic bases such as triethylamine, tripropylamine, tributylamine, tripentylamine, trihexylamine, triheptylamine, trioctylamine, diethylamine, triethanolamine, diethanolamine and an alkoxysilane having an amino group; inorganic bases such as sodium hydroxide and potassium hydroxide; anion exchange resins; and quaternary ammonium salts such as tetrabutylammonium hydroxide, tetraethylammonium hydroxide and tetramethylammonium hydroxide. The usable acid catalyst includes hydrochloric acid, nitric acid, sulfuric acid, hydrofluoric acid, phosphoric acid, acetic acid, trifluoroacetic acid, formic acid and a polycarboxylic acid or its anhydride. The molar quantity of the catalyst is preferably 0.0001 to 10 times that of the mixture of the silane compound. The polysiloxane synthesized using this kind of catalyst starts to cure when heated at the temperature of 150° C. or higher and has a feature that a fine shape can be maintained without causing any pattern reflow also after being cured.

The hydrolysis degree can be adjusted by the amount of water added in the reaction solvent. Generally, it is preferable to react water at a molar ratio of 0.01 to 10 times, preferably 0.1 to 5 times with respect to the hydrolytic alkoxy group in the Wane compound. When the amount of water added is too less than the above range, the hydrolysis degree is decreased and it becomes hard to form a film of the composition, so that this is not preferable. On the other hand, when it is too much, gelation tends to easily occur and preservation stability deteriorates, so that this is not preferable. In addition, the water used is preferably ion exchanged water or distilled water.

After completion of the reaction, the reaction solution may be neutralized using a neutralizer. An acid compound or a basic compound is used for neutralization depending on the reaction liquid. Examples of the acid compound include inorganic acids such as phosphoric acid, nitric acid, sulfuric acid, hydrochloric acid or hydrofluoric acid; and organic acids such as acetic acid, trifluoroacetic acid, formic acid, lactic acid, acrylic acid, polycarboxylic acid such as oxalic acid, maleic acid, succinic acid or citric acid and anhydride thereof, and sulfonic acid such as p-toluenesulfonic acid or methane sulfonic acid. Examples of the basic compound used for neutralization include organic bases such as triethylamine, tripropylamine, tributylamine, tripentylamine, trihexylamine, triheptylamine, trioctylamine, diethylamine, triethanolamine or diethanolamine; inorganic bases such as sodium hydroxide or potassium hydroxide; and quaternary ammonium salts such as tetrabutylammonium hydroxide, tetraethylammonium hydroxide and tetramethylammonium hydroxide. In addition, the neutralization may be conducted using a cation exchange resin.

The amount of the neutralizer is appropriately selected according to pH of the reaction solution after completion of the reaction, but its molar quantity is preferably 0.5 to 1.5 times, more preferably 1 to 1.1 times that of the catalyst. In addition, when a cation exchange resin is used, the number of ion groups contained in the cation exchange resin is preferably within the above range.

The reaction solution after neutralized may optionally be washed to refine. The washing method is not limited in particular, but, for example, the method comprises adding a hydrophobic organic solvent and optionally water to the reaction solution after neutralized, stirring to make the organic solvent come into contact with polysiloxane, and dissolving at least the polysiloxane (I) in the hydrophobic organic solvent phase. At this time, as the hydrophobic organic solvent, a compound that dissolves the polysiloxane (I) and is not miscible with water is used. Not miscible with water means that the mixture is separated into a water phase and an organic phase when allowed to stand after sufficiently mixing water and the hydrophobic organic solvent.

Preferably, the hydrophobic organic solvent includes an ether-based solvent such as diethyl ether, an ester-based solvent such as ethyl acetate, an alcohol-based solvent having poor solubility to water such as butanol, a ketone-based solvent such as methyl ethyl ketone and methyl isobutyl ketone, an aromatic-based solvent such as toluene and xylene. The hydrophobic organic solvent to be used for washing may be identical to or different from the organic solvent used as the reaction solvent and may be used as mixture of two or more kinds. Through such a washing, the catalyst and the neutralizer which are used in the reaction process as well as the formed salt, and further most of the alcohol and the water which are by-products of the reaction are contained in an aqueous layer, and they are substantially removed from the organic layer. The number of washing can be changed depending on the need.

The temperature at the time of washing is not limited in particular, but it is preferably 0° C. to 70° C., more preferably 10° C. to 60° C. In addition, the temperature to separate the water phase and the organic phase is neither limited in particular, but it is preferably 0° C. to 70° C., more preferably 10° C. to 60° C. from the viewpoint of shortening the time of liquid separation.

By conducting such a washing, coating properties and preservation stability of the composition may be improved.

The reaction solution after washed can be added to the composition of the present invention as it is, but the concentration may be optionally changed by removing the solvent and the remaining alcohol and water which are the bi-products of the reaction and further the solvent may be optionally replaced with other solvent. When the concentration is carried out, it can be conducted under normal pressure (atmospheric pressure) or reduced pressure and the concentration degree can be optionally changed by controlling the quantity of distillation. The temperature at the time of the concentration is generally 30 to 150° C., preferably 40 to 100° C. In addition, solvent replacement can be done by timely adding a desired solvent so as to make an objective solvent composition and further by concentrating.

Through such a reaction, a siloxane polymer is obtained. Although the molecular weight of the obtained siloxane polymer varies according to the type and the reaction condition of the raw materials, the weight average molecular weight of the siloxane used in the present invention in terms of polystyrene is generally 500 to 20,000, preferably 700 to 5,000, and the number average molecular weight thereof is generally 300 to 5,000, preferably 500 to 2,000. The larger the molecular weight is, the more advantageous from the viewpoint of remaining film thickness ratio, and, on the other hand, the smaller it is, the more advantageous from the viewpoint of polymer stability.

(II) A layer consisting of a siliceous material having a refractive index of 1.4 or less can be formed, for example, using a composite containing a polysiloxane and silicon oxide nanoparticles. Specifically, it can be obtained by reacting a siloxane polymer having a silanol group, a silane monomer having a silanol group or mixture thereof with silicon oxide nanoparticles having a hydroxyl group or an alkoxy group on the surface in a mixed solvent of an aqueous solvent and an organic solvent in the presence of phase transfer catalyst. A polysiloxane cured product with void can be obtained by curing such a composite of the silicon oxide nanoparticles and the silsesquioxane polymer.

Voids are formed around the nanoparticles when curing a film containing such a composite. Using such a composite, a siliceous material having a refractive index of around 1.05 to 1.40 can be obtained depending on the void ratio.

The composite of silicon oxide nanoparticles and a siloxane polymer (Hereinafter, this may be simply called "composite (II)". In addition, this composite shall be also included in polysiloxane for convenience sake.), which can be used in one embodiment of the present invention, can be manufactured by a specific manufacturing method. Specifically, this method for manufacturing comprises reacting a siloxane polymer having a silanol group, a silane monomer having a silanol group or mixture thereof with silicon oxide nanoparticles having a hydroxyl group or an alkoxy group on the surface in a mixed solvent of an aqueous solvent and an organic solvent in the presence of phase transfer catalyst. Hereinafter, this method may be referred to as "reverse micelle dispersion method". The siloxane polymer that can be used here is the same one as explained in (I).

Through such a reaction, a siloxane polymer having a hydroxyl group is obtained. Although the molecular weight of the obtained siloxane polymer varies according to the type and the reaction condition of the raw materials, the weight average molecular weight of the siloxane used in the present invention in terms of polystyrene is generally 500 to 20,000, preferably 700 to 5,000, and the number average molecular weight thereof is generally 300 to 5,000, preferably 500 to 2,000. The larger the molecular weight is, the more advantageous from the viewpoint of remaining film thickness ratio, and, on the other hand, the smaller it is, the more advantageous from the viewpoint of reactivity with silicon oxide particles and polymer stability.

In addition, in the present invention, a silane monomer can be used in place of or in combination with a siloxane polymer. Or, a silane polymer can be used in combination with a siloxane polymer. Such a silane monomer preferably includes $R^{11}Si(OR^{12})_3$ and $Si(OR^{12})_4$, which have been shown as a starting monomer for manufacturing a siloxane polymer. In the present invention, the silane monomer having a silanol group shall mean one in which a hydroxyl group is directly binding to the above Si.

The siloxane polymer according to the present invention is produced by partial chemical bonding of the above siloxane polymer having a silanol group to the above silicon oxide nanoparticles. The present invention is characterized by using of a phase transfer catalyst as the catalyst for this reaction.

In other words, siloxane is usually used in such a state that dissolved in an organic solvent. On the other hand, when silicon oxide nanoparticles are added to the siloxane polymer solution, they are generally added not in a form of powder but as dispersion prepared by dispersing the particles in an aqueous medium. This is because silicon oxide is hydrophilic as described above, which makes it difficult to disperse the particles in an organic solvent, and because they are not uniformly dispersed when solid particles in a form of powder or the like are used.

Therefore, it is hard to make the reaction sufficiently progress between an organic phase containing a siloxane and an aqueous phase containing a silicon oxide. Therefore, the reaction is promoted using a phase transfer catalyst in the present invention. Such a method is referred to as "reverse micelle dispersion method" in the present invention. The reverse micelle dispersion method is explained more specifically below.

First, a siloxane polymer having a silanol group is dissolved in an organic solvent to prepare a polymer solution. At this time, as the organic solvent, PGMEA, n-propyl acetate (hereinafter, this may be referred to as "nPA") and PGME etc. are used. Among them, preferably used ones are nPA from the viewpoint of liquid separation from an aqueous solvent and PGME from the viewpoint of stability of the composite (II) which is an end product.

On the other hand, silicon oxide nanoparticles dispersion is prepared. Such a dispersion can be prepared by producing a silicon oxide by the sol-gel method and dispersing it, but commercial products may be used as they are. For example, a silicon dioxide dispersion (average particle size: 10 to 100 nm) which is on the market as a trademark of Klebosol from AZ Electronic Materials Co., Ltd. and an aqueous dispersion of silicon dioxide dispersion (average particle size: around 30 nm) which is on the market as a trademark of NanoTek from CIK NanoTek Corporation can be used.

Then, a phase transfer catalyst of desired quantity is added to the aqueous dispersion of silicon oxide nanoparticles and subsequently a silsesquioxane polymer solution is charged to react them. In other words, the reaction is conducted in a mixed solvent of the aqueous solvent and the organic solvent.

Here, as the phase transfer catalyst, a quaternary ammonium compound, a quaternary phosphonium compound, pyridinium compound and a crown ether are used, and it is preferred to use a quaternary ammonium compound or a quaternary phosphonium compound. The quaternary ammonium compound or the quaternary phosphonium compound has an activity to promote the phase transfer to an organic phase by interacting with the hydroxyl group existing on the surface of silicon oxide nanoparticles and increasing the affinity of silicon oxide nanoparticles to the organic solvent. The pyridinium compound also has the same function. In addition, the crown ether has the same function by partially clathrating the polymer molecule. Among them, specifically, a tetrabutylammonium salt, a trioctylmethylammonium salt and a benzyldimethyloctadecylammonium salt are preferably used. The amount of the phase transfer catalyst is preferably 10 to 100 mol %, more preferably 20 to 50 mol % with respect to the number of moles of silicon oxide nanoparticles.

The blending ratio of siloxane polymer, silane monomer or mixture thereof to silicon oxide nanoparticles is adjusted depending on the purpose, but it is generally 95:5 to 5:95, preferably 30:70 to 80:20 based on the weight.

The reaction temperature is preferably −20 to 120° C., more preferably −5 to 80° C. In addition, the reaction time is not limited in particular, but if it is more than one hour, the reaction sufficiently proceeds.

In the composite (II) obtained in this way, the silanol group existing in the polymer matrix and the silicon oxide nanoparticles are chemically-bonded. This chemical bond is formed by a condensation reaction between the silanol group contained in the siloxane polymer and the hydroxyl group or the alkoxy group on the surface of the silicon oxide nanoparticles. In other words, the composite has a structure wherein the silicon atoms in the siloxane polymer and the surface of the above silicon oxide nanoparticles are bonded via oxygen atoms.

(III) A layer consisting of a siliceous material having a refractive index of 1.5 or more can be formed, for example, using a composite containing a polysiloxane and metal nanoparticles, different from the above-mentioned composite. Such a composite is, for example, a composite of metal oxide nanoparticles and a siloxane polymer, which is obtained by reacting a siloxane polymer having a silanol group, a silane monomer having a silanol group or mixture thereof with metal oxide nanoparticles having a hydroxyl group or an alkoxy group on the surface in a mixed solvent of an aqueous solvent and an organic solvent in the presence of phase transfer catalyst. From such a polysiloxane composite, a siliceous material generally having a refractive index of around 1.60 to 2.50 can be obtained.

The composite of metal oxide nanoparticles and a siloxane polymer (Hereinafter, this may be simply referred to as "composite (III)". This composite shall be also included in polysiloxane for convenience sake.), which can be used in one embodiment of the present invention, can be prepared by the above-mentioned reverse micelle dispersion method. Specifically, this method for manufacturing comprises reacting a siloxane polymer having a silanol group with metal oxide nanoparticles having a hydroxyl group or an alkoxy group on the surface in a mixed solvent of an aqueous solvent and an organic solvent in the presence of phase transfer catalyst.

The siloxane polymer that can be used here is the same one as explained in (I) and (II). In addition, a variety of metal oxide nanoparticles can be used according to the purpose, and the type of the metal are not limited in particular. Generally, "metal" is a general name for the elements of the Groups I to XII, aluminum, gallium, indium and thallium of Group XIII, tin and lead of Group XIV, and bismuth of Group XV, but shall also include boron in the present invention. Generally, many of the transition metals are useful.

In addition, depending on the type of the metal used, different properties can be imparted to the resulting cured film. Because the refractive index of the resulting cured film tends to become high particularly when nanoparticles of titanium oxide or zirconium oxide are used, they are advantageously applied to the optical functional film of the present invention.

In other cases, when europium oxide is used, fluorescence properties can be imparted to the resulting cured film; when zinc oxide is used, UV absorption properties is imparted to the resulting cured film; when boron oxide is used, the dielectric constant of the film is reduced; and when aluminum oxide is used, infrared absorption properties is imparted. From the viewpoint of improving or imparting these properties, it is preferable to use an oxide of titanium, zirconium, zinc, boron or aluminum.

In the present invention, a metal oxide having a hydroxyl group or an alkoxy group on the surface of the particle can be used as the above metal oxide. Such a metal oxide nanoparticles can be represented by the following general formula (3):

$$M_xO_y(OR^3)_z \qquad (3)$$

wherein
M is an element selected from the group consisting of Ti, Zr, Eu, Zn, B, Al, Ta and the Hf, $R^3$ is hydrogen, or a $C_1$ to $C_{10}$, preferably $C_1$ to $C_6$ alkyl or alkenyl group, and 2y+z=x·[valence of M] is satisfied.

Here, the metal element M and the substituent R may be a combination of two or more kinds.

The particle size of the metal oxide nanoparticles may affect the transmittance of the film which is finally formed. Therefore, the particle size that does not impair the transmittance is selected in accordance with the wavelength of light. Specifically, the average particle size of the metal oxide nanoparticles used in the present invention is preferably 5 to 200 nm, more desirably 20 to 100 nm. Here, the average particle size of the metal oxide nanoparticles can be determined by the dynamic light scattering measurement.

Such a metal oxide can be prepared by the common sol-gel method. On the other hand, the oxide prepared by baking hardly includes any hydroxyl group etc. Therefore, it is preferable to use the metal oxide nanoparticles prepared by the sol-gel method.

Specifically, the metal oxide nanoparticles represented by the formula (3) can be prepared by adjusting the sol using $M(OR^3)_4$ as a starting raw material.

The blending ratio of siloxane Polymer, silane monomer or mixture thereof to metal oxide nanoparticles is adjusted depending on the purpose, but it is generally 95:5 to 5:95, preferably 30:70 to 80:20 based on the weight.

The composite (III) can be manufactured using the reverse micelle dispersion method that is explained in the paragraphs for the above composite (II). However, it is necessary to replace silicon oxide nanoparticles with metal oxide nanoparticles. In addition, adjustment of the reaction temperature is necessary, and in the manufacture of the composite (III), the reaction temperature is preferably 0 to 120° C., more preferably 20 to 80° C.

In the composite (III) obtained in this way, the silanol group existing in the polymer matrix and the metal oxide nanoparticles are chemically-bonded. This chemical bond is formed by a condensation reaction between the silanol group contained in the siloxane polymer and the hydroxyl group or the alkoxy group on the surface of metal oxide nanoparticles. In other words, the composite has a structure wherein the silicon atoms in the siloxane polymer and the surface of the above metal oxide nanoparticles are bonded via oxygen atoms.

As mentioned above, the polysiloxane that can be used for manufacturing the optical functional film of the present invention has been exemplified by categorizing into three classes for convenience sake, but any polysiloxane can be used besides these. In addition, it is not necessary to select a polysiloxane used for the first layer and a polysiloxane used for the second layer from each different class of polysiloxane. In other words, it is also possible, for example, to select two different types of polysiloxane from polysiloxanes categorized in class (I) and use them each for another layer. In addition, even if the same materials are used as the polysiloxane, it is possible to prepare one layer having a lower refractive index than the other layer if the one layer is made to have a porous structure by adjusting the heating condition etc.

In addition, a mixture of two or more types of polysiloxane can be used in one composition comprising polysiloxane. In this case, the polysiloxane mixture can be regarded as one polysiloxane. For example, even if two composition comprising polysiloxane respectively contain polysiloxane (I) and (II), the polysiloxanes contained in each composition are deemed to be different when the blending ratio thereof is different each other.

The composition comprising polysiloxane used for manufacturing the optical functional film of the present invention comprises the above polysiloxane or composite and a solvent. Hereinafter, the polysiloxane or composite may be collectively referred to as "polysiloxane" for convenience sake. The solvent used here is selected from those which can dissolve the used polysiloxane.

The solvent includes, for example, ethylene glycol monoalkyl ethers such as ethylene glycol monomethyl ether, ethylene glycol monoethyl ether, ethylene glycol monopropyl ether and ethylene glycol monobutyl ether; diethylene glycol dialkyl ethers such as diethylene glycol dimethyl ether, diethylene glycol diethyl ether, diethylene glycol dipropyl ether and diethylene glycol dibutyl ether; ethylene glycol alkyl ether acetates such as methyl cellosolve acetate and ethyl cellosolve acetate; propylene glycol alkyl ether acetates such as PGMEA, propylene glycol monoethyl ether acetate and propylene glycol monopropyl ether acetate; aromatic hydrocarbons such as benzene, toluene and xylene; and ketones such as methyl ethyl ketone, acetone, methyl amyl ketone, methyl isobutyl ketone and cyclohexanone. The solvent may be used alone or in combination of two or more. The blending ratio of the solvent is, based on the total weight of the composition comprising polysiloxane, usually not less than 50% by weight, preferably not less than 60% by weight, and is usually not more than 90% by weight, preferably not more than 85% by weight. In addition, the solvents contained in the two compositions comprising polysiloxane may be identical or different each other.

In addition, the composition of the present invention may include other components as needed. Examples thereof include surfactants, lubricants and viscosity modifiers.

Among them, it is preferable to use a surfactant to improve the coating property. The surfactant that can be used for the composition of the present invention includes, for example, nonionic surfactants, anionic surfactants and amphoteric surfactants.

Examples of the above-mentioned nonionic surfactant include polyoxyethylene alkyl ethers such as polyoxyethylene lauryl ether, polyoxyethylene oleyl ether and polyoxyethylene cetyl ether; polyoxyethylene fatty acid diesters; polyoxy fatty acid monoesters; polyoxyethylene-polyoxypropylene block polymers; acetylene alcohols; acetylene glycols; polyethoxylates of acetylene alcohols; acetylene glycol derivatives such as polyethoxylates of acetylene glycols; fluorine-containing surfactants such as Fluorad (trade name, manufactured by Sumitomo 3M Ltd.), Megafac (trade name, manufactured by DIC Corporation) and Surufuron (trade name, manufactured by Asahi Glass Co., Ltd.); or organosiloxane surfactants such as KP341 (trade name, manufactured by Shin-Etsu Chemical Co., Ltd.). Examples of the above-mentioned acetylene glycol include 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol etc.

Examples of the anionic surfactant include ammonium salts or organic amine salts of alkyldiphenyl ether disulfonic acids; ammonium salts or organic amine salts of alkyldiphenyl ether sulfonic acids; ammonium salts or organic amine salts of alkylbenzenesulfonic acids; ammonium salts or organic amine salts of polyoxyethylene alkyl ether sulfuric acids; ammonium salts or organic amine salts of alkyl sulfuric acids etc.

Examples of the amphoteric surfactant include 2-alkyl-N-carboxymethyl-N-hydroxyethyl imidazolium betaine, lauric acid amide propylhydroxysulfone betaine etc.

These surfactants may be used alone or in combination of two or more, and the blending ratio thereof is usually 50 to 5,000 ppm, preferably 100 to 2,000 ppm, with respect to the total weight of the composition.

In the method for manufacturing the optical functional film of the present invention, first, the first composition comprising polysiloxane is coated on a substrate. Examples of the substrate include transparent substrates such as glasses or plastic films and semiconductor devices such as light emitting devices or light receiving devices. At this time, the first composition comprising polysiloxane is selected from those which can form a siliceous material having a close refractive index to that on the surface of the substrate coated.

The coating of the first composition comprising polysiloxane of the present invention can be conducted by a common coating method, that is, an arbitrary method such as dip coating, roll coating, bar coating, brush coating, spray coating, doctor coating, flow coating, spin coating and slit coating. When the substrate is a film, a coating film can also be formed by gravure coating. Among them, spin coating and slit coating are preferable. The composition can be coated once, twice or more times as needed to form a coating film of a desired thickness.

Then, the first layer is formed by performing insolubilizing treatment of the surface of the coated film. Here, the insolubilizing treatment of the surface is not a complete curing of the coated film. It is a treatment, which does not make the first layer formed from the first composition comprising polysiloxane and the second layer formed from the second composition comprising polysiloxane completely mixed so as to become a uniform layer on the substrate when the second composition comprising polysiloxane is coated on the first layer. Therefore, attention is required that compatibilization of the first layer, which is mentioned below, may not occur if the first layer is completely cured. A specific example of the method of insolubilizing treatment is a heat-curing. Removal of part or all of the solvent by heating and partial curing by heating are preferable insolubilizing treatments. Although the most suitable temperature varies according to the desired film thickness and composition, the heat treatment is conducted, for example, at the temperature of 100 to 200° C., preferably 120 to 170° C. The heating time is, for example, 1 to 60 minutes. More preferably, the heating time is 1 to 2 minutes. In addition to the above, the insolubilizing treatment can be performed also by means of chemical modification of the coated film surface by UV ozone irradiation or surface treatment with tetramethylammonium hydroxide solution etc. In addition, when a tetramethylammonium hydroxide solution is used, it is preferable that the concentration thereof is relatively low, so that such an aqueous solution that has a concentration of generally not higher than 5% by weight, preferably not higher than 2% by weight, more preferably not higher than 1.5% by weight is used.

The second composition comprising polysiloxane is coated to the surface of the first layer treated for insolubilizing. The coating method of this time is arbitrarily selected from the above-described methods, but spin coating is preferable to make smaller the influence on the first layer. Through this step, a laminated structure of the first layer and the second layer is formed. The coating of the second layer can be repeated twice or more times to adjust the film thickness of the coated film.

After the coating of the second layer, it is preferred that the coated film is subjected to prebaking (heat treatment) to reduce the remaining solvent. Although the most suitable temperature varies according to the desired film thickness and composition, the prebaking step can be performed at the temperature of 70 to 250° C., preferably 90 to 220° C., for 10 to 180 seconds, preferably 30 to 1000 seconds when a hot plate is used or for 1 to 30 minutes when a clean oven is used.

The heating (curing) temperature for curing the coated film can be arbitrarily selected as long as it is a temperature at which the coating film is cured. However, when the curing temperature is excessively low, the reaction may not sufficiently proceed and the coated film May thus not be sufficiently cured. Therefore, the curing temperature is preferably 150° C. or higher. In addition, when the temperature is excessively high, the production cost increases and the polymer may be decomposed, so that the curing temperature is preferably 400° C. or lower. The curing time is not particularly restricted, but it is generally 5 minutes or more, preferably 10 minutes or more.

In the method for manufacturing the optical functional film of the present invention, a compatibilizing treatment that allows the interface between the first layer and the second layer to disappear is performed. The compatibilizing treatment is performed at any stage, and specifically, it is performed between when the second layer is coated to the surface of the first layer and when the heat curing treatment is completed.

In the compatibilizing treatment, different kinds of polysiloxane are mixed with each other in the vicinity of the interface of the first layer and the second layer. One method to realize such a compatibilizing treatment is heat treatment. This compatibilizing treatment can be performed at the same time with the heat treatment for curing the coated film. In other words, mixing of the polysiloxanes in the vicinity of the interface of the first layer and the second layer can be realized by appropriately adjusting the conditions such as the temperature to perform the prebaking after the coating of the second layer or to conduct the heat-curing. In addition to the above, if a solvent which can dissolve the surface of the insolubilized first layer is selected as the solvent for the second composition comprising polysiloxane, the first layer is dissolved in the vicinity of the contacting parts of the first layer and the second layer and can be compatibilized with the second layer. Besides, the compatibilization in the vicinity of the contacting parts of the first layer and the second layer can be realized by utilizing the difference of dielectric constant between the polysiloxane contained in the first layer and the polysiloxane contained in the second layer and applying electric field after the coating of the second layer. In either case, unless the insolubilizing treatment after the coating of the first layer is properly done, the compatibilization cannot be realized, so that an insolubilizing treatment matched to each compatibilizing treatment is required.

In addition, it is also possible to perform the insolubilizing treatment by the same method mentioned above after the coating of the second layer and to coat further another composition comprising polysiloxane to provide a third layer. Furthermore, an optical functional film of multilayered constitution can be also formed by repetitive laminations in this way. For example, by constituting a three layer structure using three composition comprising polysiloxane, an optical functional film having a pattern of the refractive index that is shown in FIG. 4 can be formed. However, it is preferable that the number of the laminations is less in order to prepare more easily an optical functional film of a less reflected light. Specifically, a structure of three layers or less is preferable, and that of two layers is the most preferable.

Semiconductor Device

Because of a little reflected light of the optical functional film according to the present invention, it is useful to use it for the surface of semiconductor devices etc. Further, it is excellent in transmittance, strength, dielectric constant etc. because it is formed from a siliceous material. Therefore, semiconductor devices comprising the optical functional film of the present invention such as solar batteries, LEDs and OLEDs show superior properties. Further, since high temperature resistance, environmental resistance, light resistance or chemical resistance are required particularly for devices which utilize light such as light emitting devices and solar batteries, the optical functional film of the present invention formed from a siliceous material is particularly useful for them.

The present invention is concretely explained by use of the following examples.

Production Example 1 (Production of Composition A Comprising Methyl Silsesquioxane)

A reaction solvent was prepared by mixing 20 g of sodium hydroxide, 300 ml of isopropyl alcohol (hereinafter referred to as "IPA") and 13.5 g of water in a 2 L flask equipped with a stirrer, a thermometer and a condenser, and maintained at 10° C. Further, a mixture solution was prepared by adding 68 g of methyl trimethoxysilane. The mixture solution was dropped to the reaction solvent at 10° C. using a dropping funnel and stirred for two hours while maintaining at 10° C., and thereafter neutralized by adding 10% HCl solution. 200 ml of toluene and 300 ml of water were added in the reaction liquid, and the resulting reaction liquid was shook and thereafter allowed to separate into two layers.

The solvent was removed from the obtained organic layer by concentrating it under reduced pressure and PGMEA was added to the concentrate so that its solid matter concentration became 10% by weight, and the composition A comprising methyl silsesquioxane (hereinafter referred to as "composition A") was prepared. The average weight molecular weight (in terms of polystyrene) of the obtained methyl silsesquioxane was 3,562.

Production Example 2 (Production of Composition B Comprising Methylphenyl Silsesquioxane)

A reaction solvent was prepared by mixing 36.5 g of 25 wt. % tetramethylammonium hydroxide solution, 300 ml of IPA and 1.5 g of water in a 2 L flask equipped with a stirrer, a thermometer and a condenser, and maintained at 10° C. Further, a mixture solution consisting of 44.6 g of phenyl trimethoxysilane, 34.1 g of methyl trimethoxysilane and 3.8 g of tetramethoxysilane was prepared. The mixture solution was dropped to the reaction solvent at 10° C. using a dropping funnel and stirred for two hours while maintaining at 10° C., and thereafter neutralized by adding 10% HCl solution. 200 ml of toluene and 300 ml of water were added in the reaction liquid, and the resulting reaction liquid was shook and thereafter allowed to separate into two layers.

The solvent was removed from the obtained organic layer by concentrating it under reduced pressure and PGMEA was added to the concentrate so that its solid matter concentration became 10% by weight, and the composition B comprising methyl phenyl silsesquioxane (hereinafter referred to as "composition B") was prepared. The average weight molecular weight (in terms of polystyrene) of the obtained methyl phenyl silsesquioxane was 2,180.

Comparative Example 1

Figure 6:
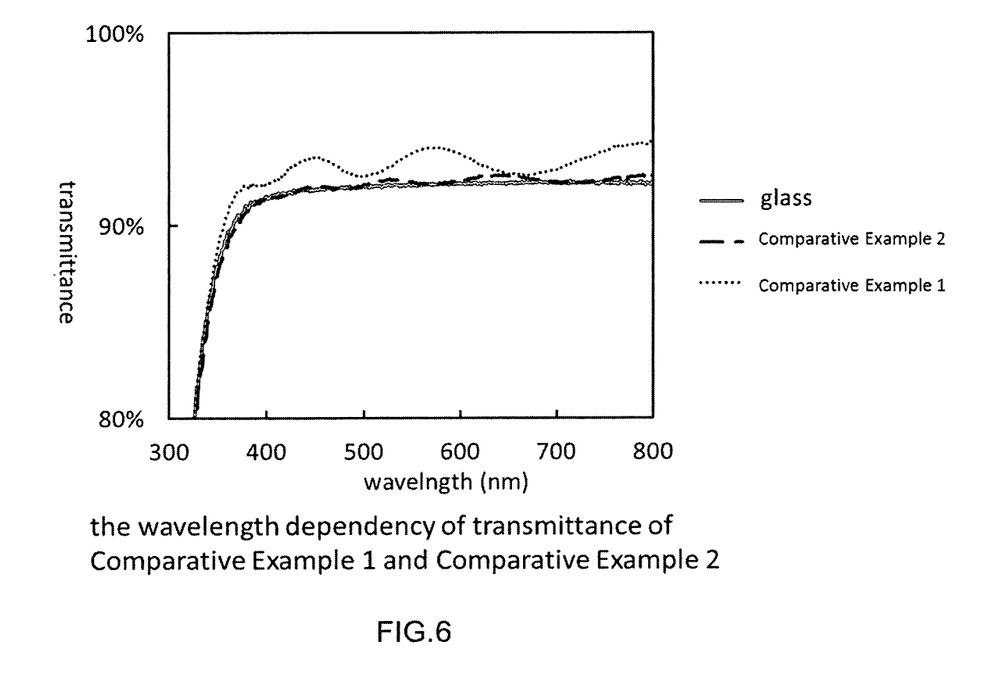
FIG. 6 is a figure showing the wavelength dependency of transmittance of Comparative Example 1 and Comparative Example 2.

Composition A was coated to the surface of the glass substrate and prebaked at 100° C. for 90 seconds. Thereafter it was heated at 300° C. for one hour to form a film having a thickness of 1 μm. The refractive index of the glass substrate was 1.48 and that of the film was 1.38. At this time, transmittance was as shown in FIG. 6, and the average thereof from 450 nm to 800 nm was 93.3%. This is thought to be the result that transmitted light decreased due to the reflection at the interface of the incident light and the glass (theoretical value calculated from the refractive index: 3.87%), the reflection at the interface of the glass and the film (theoretical value: 0.15%) and the reflection at the interface of the film and air (theoretical value: 2.55%). In addition, the theoretical value of the transmittance is 92.38%.

Here, the theoretical values were calculated by substituting the above-mentioned values of refractive indices (the glass: 1.48, the film: 1.38, and air: 1.00) for $R_f=(n_1-n_0)^2/(n_1+n_0)^2$, which is mentioned above. This is the same hereinafter in the calculation of theoretical values.

In addition, wavelength dependency of the transmittance was observed in Comparative Example 1 as shown in FIG. 6. This is supposed that a light reflection occurred at the interface of the glass substrate and the film and thus interference of the reflected light was caused due to a considerable difference between the refractive index of the film and that of the glass substrate.

Comparative Example 2

Composition B was coated to the surface of the glass substrate and prebaked at 100° C. for 90 seconds. Thereafter it was heated at 300° C. for 30 minutes to form a film having a thickness of 1 μm. The refractive index of the film was 1.49.

At this time, transmittance was as shown in FIG. 6, and the average of transmittance from 450 nm to 800 nm was 92.3%. This is thought to be the result that transmitted light decreased due to the reflection at the interface of the incident light and the glass (theoretical value calculated from the refractive index: 3.87%), the reflection at the interface of the glass and the film (theoretical value: 0.00%) and the reflection at the interface of the film and air (theoretical value: 3.75%).

In addition, the theoretical value of the transmittance is 92.23%.

In addition, as well as the case wherein a glass is used alone, wavelength dependency of the transmittance was hardly confirmed in Comparative Example 2 as shown in FIG. 6. This is supposed that because the refractive index of the film is nearly identical with that of the glass, no reflection occurred between the glass and the film, and thus no interference of light was caused.

Example 1

Figure 7:
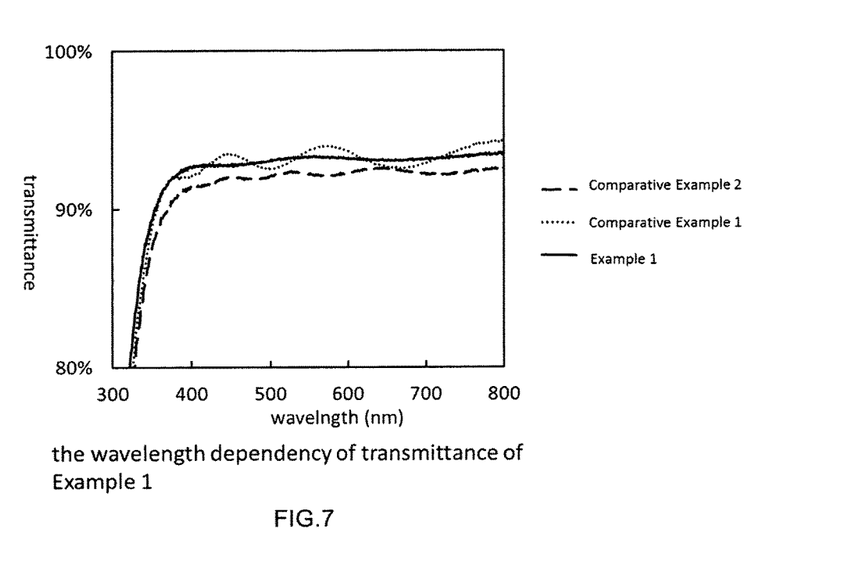
FIG. 7 is a figure showing the wavelength dependency of transmittance of Example 1.

Composition B was coated to the surface of the glass substrate to form a film having a thickness of 500 nm and it was heated at 150° C. for 90 seconds to form a first layer. Composition A was then coated to form a film having a thickness of 500 nm and prebaked at 200° C. for 90 seconds. Thereafter, by heating at 300° C. for 1 hour, the first layer and the second layer were completely cured. In other words, the first layer and the second layer having a different refractive index each other were laminated to form an optical functional film in which parts of the interface of these layers was compatibilized. At this time, transmittance was as shown in FIG. 7, and the average of transmittance from 450 nm to 800 nm was 93.2%. This is thought to be the result that transmitted light decreased due to the reflection at the interface of the incident light and the glass (theoretical value calculated from the refractive index: 3.87%), the reflection at the interface of the glass and the film (theoretical value: 0.00%, when the refractive index of part near to the glass in the optical functional film is assumed to be 1.49) and the reflection at the interface of the optical functional film and air (theoretical value: 2.55%, when the refractive index of the part near to air in the optical functional film is assumed to be 1.38). In addition, the theoretical value of the transmittance is 93.58%.

In addition, wavelength dependency of the transmittance was hardly observed as shown in FIG. 7. This is supposed that because the refractive index of the film is nearly identical with that of the glass, no reflection occurred between the glass and the film, and thus no interference of light was caused.

From the above, it can be said that Example 1 exhibits an excellent optical functional film which is superior in transmittance and has no wavelength dependency of transmittance.

Comparative Examples 3 to 5

An optical functional film was formed by the same way as Example 1 except the heating temperature just after the coating of composition B for the first layer. The heating temperatures of Comparative Examples 3, 4 and 5 were respectively 130° C., 170° C. and 200° C.

Figure 8:
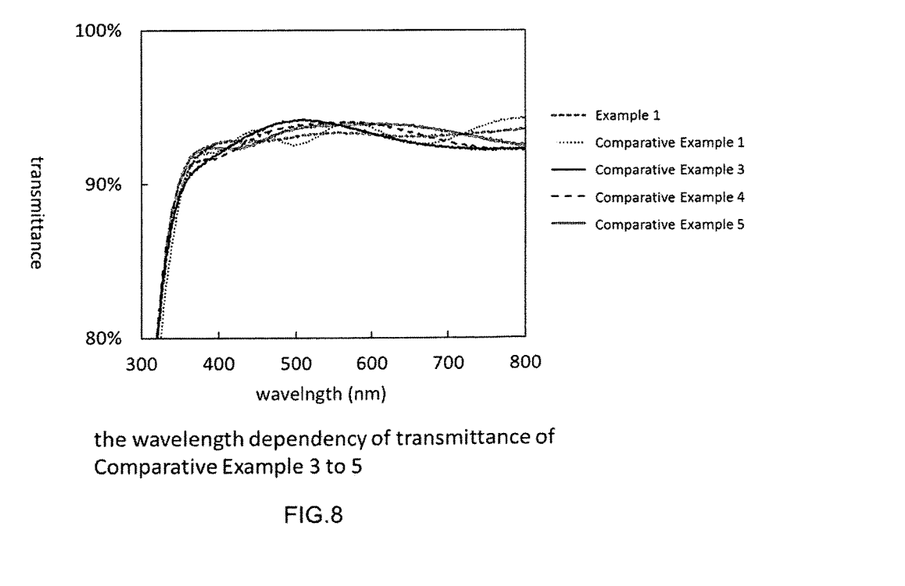
FIG. 8 is a figure showing the wavelength dependency of transmittance of Comparative Examples 3 to 5.
Figure 9:
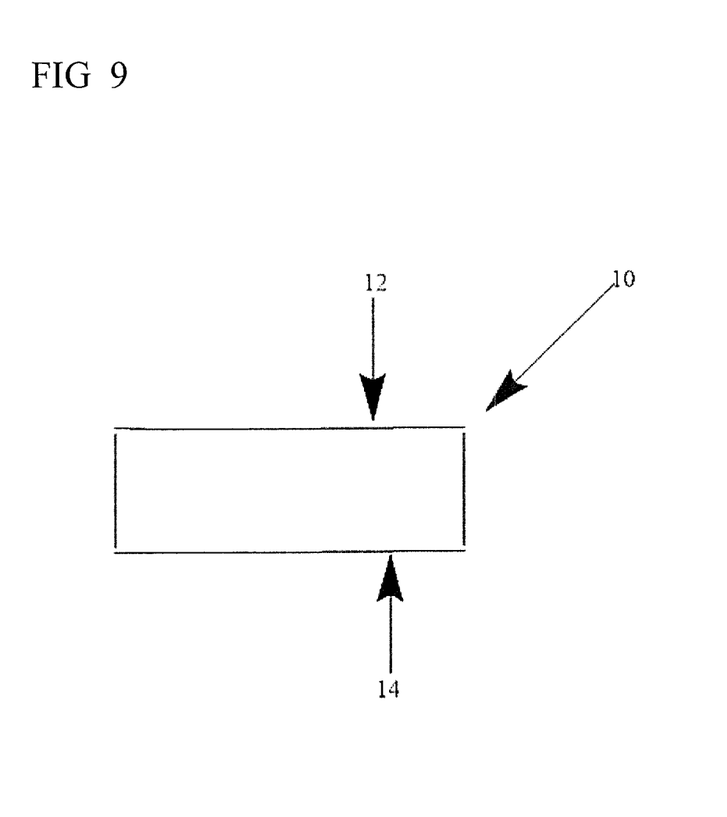
FIG. 9 is a figure showing the film 10 having a side A 12 and a side B 14.

At this time, transmittance was as shown in FIG. 8, and the average of transmittance from 450 nm to 800 nm was equal to Example.

In Comparative Example 3, wavelength dependency of transmittance was slightly observed as shown in FIG. 8. This is supposed that because the heating temperature just after the coating of composition B was low, a part of the first layer dissolved at the time of the coating of composition A for the second layer and, as the result, effect of improving the wavelength dependency relying on the structure observed in Example 1 was not obtained to the extent.

Since an optical functional film having a little wavelength dependency of transmittance is required, it is thought that optimization of the heating temperature after the coating of the first layer is necessary.

The invention claimed is:

1. An optical functional film comprising a siliceous material, wherein a refractive index $n_a$ of one surface A of said optical functional film to light is larger than a refractive index $n_b$ of the other side surface B to light, and the refractive index to light gradually decreases from said surface A to said surface B and wherein when a refractive index of a medium X coming into contact with said surface A is $n_x$ and a refractive index of a medium Y coming into contact with said surface B is $n_y$, the relation $$n_y < n_b < n_a < n_x$$

is satisfied and wherein the optical functional film is manufactured by the steps comprising a first layer forming step which comprises coating a composition comprising a polysiloxane and a solvent on a substrate and performing insolubilizing treatment by heating of the surface to form the first layer; a second layer forming step which comprises coating a composition comprising a polysiloxane that is different from said polysiloxane and a solvent that is identical to or different from said solvent on the surface of said first layer to form the second layer; and a heating step of heating to cure at 150° C. or higher said first layer and said second layer, wherein the contacting parts of said first layer and said second layer are compatibilized such that there is no interface between the first layer and the second layer caused by said first layer and second layer having different refractive indices and the compatibilizing is performed by a prebaking or a heat-curing between after starting said second layer forming step and until ending said heating step.

2. The optical functional film according to claim 1, wherein said siliceous material is formed from a polysiloxane having a silanol group, as a raw material.

3. The optical functional film according to claim 2, wherein said polysiloxane is obtained by hydrolyzing and condensing a silane compound of the general formula (1) in the presence of an acidic or basic catalyst:

$$R^{11}_n Si(OR^{12})_{4-n} \quad (1)$$

wherein $R^{11}$ is a linear, branched or cyclic alkyl group having 1 to 20 carbon atoms, in which any methylene may be replaced with oxygen, or an aryl group having 6 to 20 carbon atoms, in which any hydrogen may be replaced with fluorine, $R^{12}$ is a alkyl group having 1 to 6 carbon atoms, and n is 0, 1 or 2.

4. The optical functional film according to claim 2, wherein said polysiloxane is a composite of silicon oxide nanoparticles and a siloxane polymer, which is obtained by reacting a siloxane polymer having a silanol group, a silane monomer having a silanol group or mixture thereof with silicon oxide nanoparticles having a hydroxyl group or an alkoxy group on the surface in a mixed solvent of an aqueous solvent and an organic solvent in the presence of phase transfer catalyst.

5. The optical functional film according to claim 2, wherein said polysiloxane is a composite of metal oxide nanoparticles and a siloxane polymer, which is obtained by reacting a siloxane polymer having a silanol group, a silane monomer having a silanol group or mixture thereof with metal oxide nanoparticles having a hydroxyl group or an alkoxy group on the surface in a mixed solvent of an aqueous solvent and an organic solvent in the presence of phase transfer catalyst.

6. The optical functional film according to claim 5, wherein said metal oxide nanoparticles are represented by the following general formula (3):

$$M_x O_y (OR^3)_z \quad (3)$$

wherein

M is an element selected from the group consisting of Ti, Zr, Eu, Zn, B, Al, Ta and Hf, $R^3$ is hydrogen, or a Ci to Cio alkyl or alkenyl group, and $2y+z=x \cdot [\text{valence of M}]$ is satisfied.

7. The optical functional film according to claim 1, wherein said insolubilizing treatment is performed by a step selected from the group consisting of heat curing, UV ozone irradiation and surface treatment by tetramethylammonium hydroxide solution.

8. A semiconductor device, comprising said optical functional film according to claim 1 on a substrate surface.

9. A semiconductor device according to claim 8, wherein said surface A of the optical functional film comes into contact with said substrate surface.

10. The semiconductor device according to claim 9, wherein a refractive index $n_s$ of said substrate is larger than said refractive index $n_a$ of said surface A.

11. The optical functional film according to claim 1, wherein the polysiloxane comprises a reactive group excluding silanol group or alkoxyl group is 10 mol % or less based on the total number of hydrogen or substituents binding to the silicon atom.

* * * * *